US008795433B2

(12) United States Patent
Akao et al.

(10) Patent No.: US 8,795,433 B2
(45) Date of Patent: Aug. 5, 2014

(54) SUBSTRATE PROCESSING APPARATUS

(75) Inventors: Tokunobu Akao, Toyama (JP);
Kazuyoshi Yamamoto, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1133 days.

(21) Appl. No.: 12/382,222

(22) Filed: Mar. 11, 2009

(65) Prior Publication Data
US 2009/0229518 A1 Sep. 17, 2009

(30) Foreign Application Priority Data

Mar. 14, 2008 (JP) .................................. 2008-066043
Dec. 26, 2008 (JP) .................................. 2008-333178

(51) Int. Cl.
*C23C 16/00* (2006.01)
*C23F 1/00* (2006.01)
*H01L 21/306* (2006.01)
*G06F 19/00* (2011.01)
*G05B 19/418* (2006.01)
*H01L 21/67* (2006.01)

(52) U.S. Cl.
CPC .. *G05B 19/4183* (2013.01); *G05B 2219/31291* (2013.01); *H01L 21/67276* (2013.01); *G05B 2219/31304* (2013.01)
USPC ....................... 118/715; 156/345.24; 700/121

(58) Field of Classification Search
USPC ........................ 156/345.24; 700/108–110, 121
See application file for complete search history.

(56) References Cited

U.S. PATENT DOCUMENTS

| 2003/0060922 A1* | 3/2003 | Schauer et al. ............... 700/213 |
| 2003/0113945 A1* | 6/2003 | Kagoshima et al. ........... 438/14 |
| 2004/0243268 A1* | 12/2004 | Hsieh et al. ................... 700/108 |
| 2006/0282189 A1* | 12/2006 | Akisawa et al. .............. 700/108 |

FOREIGN PATENT DOCUMENTS

| JP | A-06-068102 | 3/1994 |
| JP | A-11-121586 | 4/1999 |
| JP | A-11-190639 | 7/1999 |

OTHER PUBLICATIONS

Oct. 23, 2012 Office Action issued in Japanese Patent Application No. 2010-069703 (with translation).

* cited by examiner

*Primary Examiner* — Rakesh Dhingra
(74) *Attorney, Agent, or Firm* — Oliff PLC

(57) ABSTRACT

There is provided a substrate processing apparatus that can easily grasp the relationship of a defect substrate between plural batches.

A substrate processing apparatus 10 includes: a display unit 16; a storage unit that accumulates and stores production information of the substrate for each batch, the production information being produced when the substrate is processed; a selection receiving unit that receives the selection of plural batches stored in the storage unit; and a display control unit that controls such that substrate information is displayed on the display part, the substrate information being information relating to a state in which the substrates are held the substrate holding part in the plural batches received by the selection receiving unit.

16 Claims, 14 Drawing Sheets

FIG. 6

| | INSPECTION DATE: AUGUST 20 | INSPECTION DATE: SEPTEMBER 5 | INSPECTION DATE: SEPTEMBER 21 |
|---|---|---|---|
| 1 Batch | PROCESSING DATE: JUNE 1 | PROCESSING DATE: JUNE 3 | PROCESSING DATE: JUNE 5 |
| | Batch001 | Batch002 | Batch003 |

Batch001:
- Side Dummy1 (Wafer 10 pieces)
- Monitor1
- Lot001 (Wafer 25 pieces)
- Monitor2
- Lot006 (Wafer 10 pieces)
- Lot007 (Wafer 10 pieces)
- Lot008 (Wafer 7 pieces)
- Monitor3
- Side Dummy2 (Wafer 15 pieces)

Batch002:
- Side Dummy1 (Wafer 7 pieces)
- Monitor 1
- Lot010 (Wafer 7 pieces)
- Lot011 (Wafer 5 pieces)
- Lot012 (Wafer 5 pieces)
- Lot013 (Wafer 11 pieces)
- Monitor2
- Lot014 (Wafer 11 pieces)
- Lot015 (Wafer 9 pieces)
- Lot016 (Wafer 8 pieces)
- Monitor3
- Side Dummy2 (Wafer 14 pieces)

Batch003:
- Side Dummy1 (Wafer 7 pieces)
- Monitor 1
- Lot020 (Wafer 7 pieces)
- Lot021 (Wafer 7 pieces)
- Lot022 (Wafer 14 pieces)
- Monitor2
- Lot023 (Wafer 9 pieces)
- Lot024 (Wafer 11 pieces)
- Lot025 (Wafer 8 pieces)
- Monitor3
- Side Dummy2 (Wafer 14 pieces)

FIG. 8

| No. | Apparatus Name | CJob | PJob | LotID | Recipe Name | Recipe Start Time | Recipe End Time |
|---|---|---|---|---|---|---|---|
| 55 | ○○○ | △△△ | □□□ | Lot025 | x x x | 2006/11/01 13:30:23 | 2006/11/02 03:38:41 |
| 54 | | | | Lot004 | | 2006/10/30 18:51:41 | 2006/10/31 18:16:34 |
| 53 | | | | Lot001,Lot002 | | 2006/10/30 18:37:57 | 2006/10/30 18:39:57 |
| 52 | | | | Lot3555 | | 2006/10/27 18:42:44 | 2006/10/27 18:39:37 |
| 51 | | | | Lot3552 | | 2006/10/27 13:17:21 | 2006/10/27 15:27:13 |
| 50 | | | | Lot3743 | | 2006/10/10 10:48:07 | 2006/10/10 13:10:59 |
| 49 | | | | Lot2979 | | 2006/10/03 13:42:53 | 2006/10/03 16:08:23 |
| 48 | | | | Lot2574 | | 2006/09/21 18:54:41 | 2006/09/21 21:34:33 |
| 47 | | | | Lot1971 | | 2006/09/14 14:25:57 | 2006/09/14 16:16:17 |
| 46 | | | | | | 2006/08/22 13:40:18 | 2006/08/22 15:25:53 |
| 45 | | | | | | 2006/08/07 18:03:44 | 2006/08/07 19:09:45 |
| 44 | | | | Lot1631 | | 2006/08/07 15:59:03 | 2006/08/08 10:49:03 |
| 43 | | | | Lot1629 | | 2006/08/07 15:42:36 | 2006/08/07 15:50:02 |
| 42 | | | | Lot1623 | | 2006/08/07 10:37:09 | 2006/08/07 10:50:12 |
| 41 | | | | Lot1621 | | 2006/08/07 10:25:21 | 2006/08/07 10:39:05 |
| 40 | | | | Lot1619 | | 2006/07/07 10:20:48 | 2006/08/07 10:29:22 |
| 39 | | | | Lot877 | | 2006/07/07 13:20:48 | 2006/07/07 13:33:00 |
| 38 | | | | Lot854 | | 2006/07/06 13:00:08 | 2006/07/06 15:25:49 |
| 37 | | | | Lot833 | | 2006/07/05 18:03:21 | 2006/07/05 18:04:52 |
| 36 | | | | Lot831 | | 2006/07/05 15:50:24 | 2006/07/05 15:51:14 |
| 35 | | | | Lot828 | | 2006/07/05 13:22:46 | 2006/07/05 14:40:19 |
| 34 | | | | Lot825 | | 2006/07/05 02:27:09 | 2006/07/05 12:05:36 |
| 33 | | | | Lot804 | | 2006/07/04 13:36:35 | 2006/07/04 15:21:59 |
| 32 | | | | Lot097 | | 2006/07/04 13:12:26 | 2006/07/04 16:43:39 |

Job List Screen
File(F) Help(H)
Narrowing Condition
Apparatus Name — 301
LotID — 302
Recipe Name — 303
Recipe Start Time — 304
2006/05/30 ~ 2007/04/01
CJob — 305
PJob — 306
Search(S) — 307
300

Total Number: 271    10 / 12 page    Previous Page(P)    Next Page(N)

| Wafer Information | | | | | | | |
|---|---|---|---|---|---|---|---|
| File | | | | | | | |
| Product Information | | | | | | | 600 |
| | Apparatus Name | CJob | PJob | LotID | Recipe Name | Recipe Start Time | Recipe End Time |
| Object | | | | Lot 2524 | | 2006/09/14 14:29:53 | 2006/09/14 16:16:17 |
| Comparison1 | | | | Lot 3143 | | 2006/10/10 10:48:07 | 2006/10/10 13:17:59 |
| Comparison2 | | | | | | | |
| Comparison3 | | | | | | | |
| Comparison4 | | | | | | | |
| Comparison5 | | | | | | | |
| Comparison6 | | | | | | | |
| Comparison7 | | | | | | | |
| Comparison8 | | | | | | | |

Wafer Information

| | Object | Comparison1 | Comparison2 | Comparison3 | Comparison4 | Comparison5 | Comparison6 | Comparison7 | Comparison8 |
|---|---|---|---|---|---|---|---|---|---|
| Boat Slot No | Lot ID | CarrierID | | | | | | | |
| | A | B | B | A | B | A | A | A | B |
| 95 | Lot 2524 | Lot 3143 | | | | | | | |
| 94 | Lot ⋯ | ⋯ | ⋯ | ⋯ | ⋯ | ⋯ | ⋯ | ⋯ | ⋯ |
| 93 | | | | | | | | | |
| 92 | | | | | | | | | |
| 91 | | | | | | | | | |
| 90 | | | | | | | | | |
| 89 | | | | | | | | | |
| 88 | | | | | | | | | |
| 87 | | | | | | | | | |
| 86 | | | | | | | | | |
| 85 | | | | | | | | | |
| 84 | | | | | | | | | |
| 83 | | | | | | | | | |
| 82 | | | | | | | | | |
| 81 | | | | | | | | | |
| 80 | | | | | | | | | |
| 79 | | | | | | | | | |
| 78 | | | | | | | | | |
| 77 | | | | | | | | | |

801  802  700

OK   Cancel   Export

FIG. 13A

Wafer Information

Product Information

| | Apparatus Name | CJob | PJob | LotID | Recipe Name | Recipe Start Time | Recipe End Time |
|---|---|---|---|---|---|---|---|
| Object | EQ01 | CJ01 | PJ01 | Lot001 | RECIPE01 | 2007/06/14 10:16:30 | 2007/06/14 10:17:30 |
| Comparison1 | EQ01 | CJ02 | PJ02 | Lot002 | RECIPE01 | 2007/06/14 10:16:30 | 2007/06/14 10:17:30 |
| Comparison2 | EQ01 | CJ03 | PJ03 | Lot003 | RECIPE01 | 2007/06/14 10:16:30 | 2007/06/14 10:17:30 |
| Comparison3 | EQ01 | CJ04 | PJ04 | Lot004 | RECIPE01 | 2007/06/14 10:16:30 | 2007/06/14 10:17:30 |
| Comparison4 | EQ01 | CJ05 | PJ05 | Lot005 | RECIPE01 | 2007/06/14 10:16:30 | 2007/06/14 10:17:30 |
| Comparison5 | EQ01 | CJ06 | PJ06 | Lot006 | RECIPE01 | 2007/06/14 10:16:30 | 2007/06/14 10:17:30 |
| Comparison6 | EQ01 | CJ07 | PJ07 | Lot007 | RECIPE01 | 2007/06/14 10:16:30 | 2007/06/14 10:17:30 |
| Comparison7 | EQ01 | CJ08 | PJ08 | Lot008 | RECIPE01 | 2007/06/14 10:16:30 | 2007/06/14 10:17:30 |
| Comparison8 | EQ01 | CJ09 | PJ09 | Lot009 | RECIPE01 | 2007/06/14 10:16:30 | 2007/06/14 10:17:30 |

Wafer Information

| | Lot ID | | CarrierID | | | | | | | | | | | | | | | |
|---|---|---|---|---|---|---|---|---|---|---|---|---|---|---|---|---|---|---|
| | Object | | Comparison1 | | Comparison2 | | Comparison3 | | Comparison4 | | Comparison5 | | Comparison6 | | Comparison7 | | Comparison8 | |
| Boat Slot No | A | B | A | B | A | B | A | B | A | B | A | B | A | B | A | B | A | B |
| 95 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 94 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 93 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 92 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 91 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 90 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 89 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 88 | Lot 001 | Lot 002 | Lot 002 | Lot 003 | Lot 003 | Lot 004 | Lot 004 | Lot 005 | Lot 005 | Lot 006 | Lot 006 | Lot 007 | Lot 007 | Lot 008 | Lot 008 | Lot 009 | | |
| 87 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 86 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 85 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 84 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 83 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 82 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 81 | Lot 001 | Lot 002 | Lot 002 | Lot 003 | Lot 003 | Lot 004 | Lot 004 | | | Lot 006 | Lot 006 | Lot 007 | Lot 007 | Lot 008 | Lot 008 | Lot 009 | | |
| 80 | Lot 001 | Lot 002 | Lot 002 | Lot 003 | Lot 003 | Lot 004 | Lot 004 | | | | | Lot 007 | Lot 007 | Lot 008 | Lot 008 | Lot 009 | | |
| 79 | Lot 001 | Lot 002 | Lot 002 | Lot 003 | Lot 003 | Lot 004 | Lot 004 | | | | | Lot 007 | Lot 007 | Lot 008 | Lot 008 | Lot 009 | | |
| 78 | Lot 001 | Lot 002 | Lot 002 | Lot 003 | Lot 003 | Lot 004 | Lot 004 | | | | | Lot 007 | Lot 007 | Lot 008 | Lot 008 | Lot 009 | | |
| 77 | Lot 001 | Lot 002 | Lot 002 | Lot 003 | Lot 003 | Lot 004 | Lot 004 | | | | | Lot 007 | Lot 007 | Lot 008 | Lot 008 | Lot 009 | | |

OK    Cancel    Export

FIG. 13B

SUBSTRATE PROCESSING APPARATUS

BACKGROUND OF THE INVENTION

1. Field of the Invention

The present invention relates to a substrate processing apparatus that processes a semiconductor wafer, a glass substrate, and the like.

2. Description of the Related Art

A substrate processing apparatus accumulates production information when a substrate holding part having many substrates loaded therein is loaded into and processed in a processing furnace. The production information includes: process monitoring information such as a processing temperature and a gas flow rate; processing performance information such as a recipe name used in the processing and a processing date and time; production management information such as a batch ID, a lot ID, and a carrier ID; and substrate identification information such as a substrate ID. Hereinafter, the history of the production information is abbreviated as a production history. Conventionally, the processing that loads the substrate holding part having many substrates loaded therein into the processing furnace and which processes the many substrates all together is referred to as a batch processing.

When the substrate that has been processed by the substrate processing apparatus is passed to a latter process after the processing in a former process is finished and, for example, a defect is found in an inspection process, the substrate processing apparatus uses production management information such as the batch ID, the lot ID, and the carrier ID as first information for searching which process the defect is caused in.

A patent document 1 discloses a production information display apparatus that displays the present production information and the past production information in comparison with each other.

[Patent document 1] JP-A 11-190639

However, a substrate processing apparatus in the prior art presents the following problem: that is, production information relating to the substrates of only one batch is just displayed, which makes it difficult to grasp the production information relating to the substrates of plural batches.

SUMMARY OF THE INVENTION

An object of the present invention is to provide a substrate processing apparatus that can solve the problem in the prior art and which can easily grasp the relationship of a defect substrate (substrate that causes a defect) between plural batches.

The feature of the present invention lies in a substrate processing apparatus that loads a substrate holding part having many substrates loaded therein into a processing furnace and which performs a predetermined processing to the substrates. The substrate processing apparatus includes: a storage unit that accumulates and stores production information relating to the substrate at each processing, the production information being produced when the substrate is processed; a display part that displays a production history stored in the storage unit; an operation unit that includes a reception part that receives plural selections of the displayed production history and a substrate information switching part that switches to a substrate information screen to show information relating to a state in which the substrate is held the substrate holding part; and a display control unit that controls such that the information relating to the state in which the substrate is held the substrate holding part with respect to the selected plural production histories is displayed when the substrate information switching part is pressed down.

Effect of the Invention

According to the invention, in each substrate processing apparatus, the information relating to the state in which the substrates are held in the plural batches can be displayed on the same screen, so that the relationship of the defect substrate between the plural batches can be easily found. As a result, the operation of performing the processing to the substrates in a state where the cause of the defect substrate is not found can be decreased, which results in increasing production yield and decreasing the number of substrates to be discarded.

Moreover, a sensor and the like cannot be disposed in the furnace of the apparatus, so that it is difficult to find an defect in the furnace. However, if a phenomenon that a substrate processed in a specific place becomes a defect is caused, a part with a defect in the furnace can be determined by the phenomenon at an early stage.

Further, when the function of displaying information relating to the state in which the substrates are held in the plural batches and of comparing the information between the plural batches is combined with the other information (information of a lot with a defect), the time required to find a defect and to pursue the cause of the defect can be made shorter.

BRIEF DESCRIPTION OF THE DRAWINGS

FIG. 6 is a schematic diagram to show the relationship between a wafer placed in a boat and a lot ID when a defect is caused.

FIG. 8 is a screen diagram to show a first example of a production history in the embodiment of the invention.

FIG. 10 is a screen diagram to show a wafer information list in the embodiment of the invention.

FIGS. 13A and 13B are screen diagrams to show a wafer information list in the other embodiment of the invention.

DETAILED DESCRIPTION OF THE PREFERRED EMBODIMENTS

Figure 1:
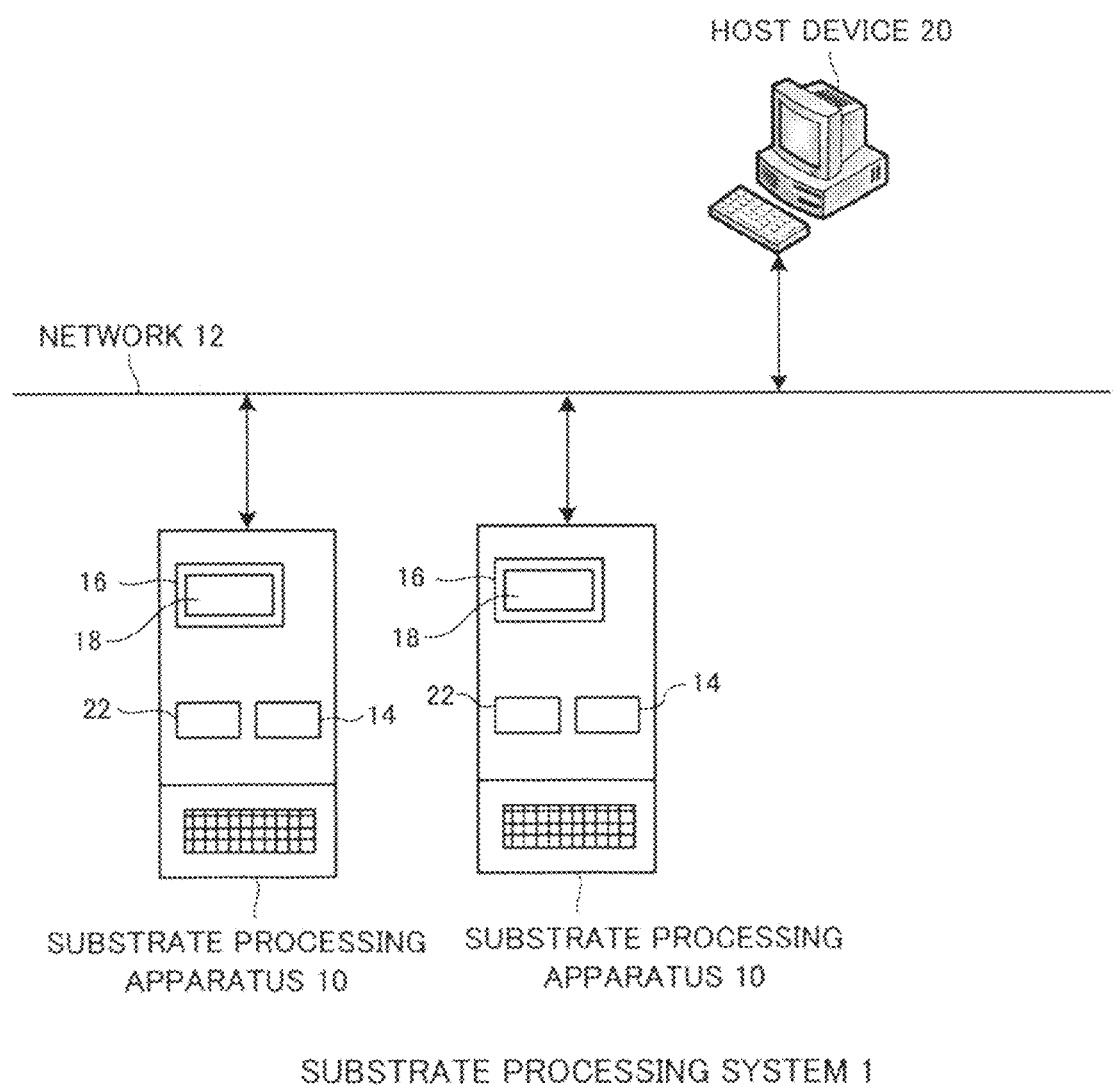
FIG. 1 is a construction diagram to show the construction of a substrate processing system including a substrate processing apparatus according to an embodiment of the present invention.

FIG. 1 is a diagram to show the construction of a substrate processing system 1 including substrate processing apparatuses 10 according to an embodiment of the present invention.

As shown in FIG. 1, the substrate processing system 1 includes the substrate processing apparatuses 10 and a host device 20. The substrate processing apparatuses 10 and the host device 20 are connected to each other through a network 12 such as a LAN. Thus, an instruction from the host device 20 is transmitted to the substrate processing apparatuses 10 through the network 12. Here, the substrate processing system 1 may include plural substrate processing apparatuses 10.

In the substrate processing apparatus 10, an input/output device 16 is integrated with the substrate processing apparatus 10 or is connected to the substrate processing apparatus 10 through the network 12 and has an operation display screen 18. The operation display screen 18 has an input screen and a display screen displayed thereon, the input screen to receive the input of predetermined data from a user (operator), the display screen to show the state of the apparatus. Moreover, the substrate processing apparatus 10 has a process system controller 14 and a carrying system controller 22 disposed therein, and the respective devices in the substrate processing apparatus 10 are controlled by the process system controller 14 and the carrying system controller 22.

Figure 2:
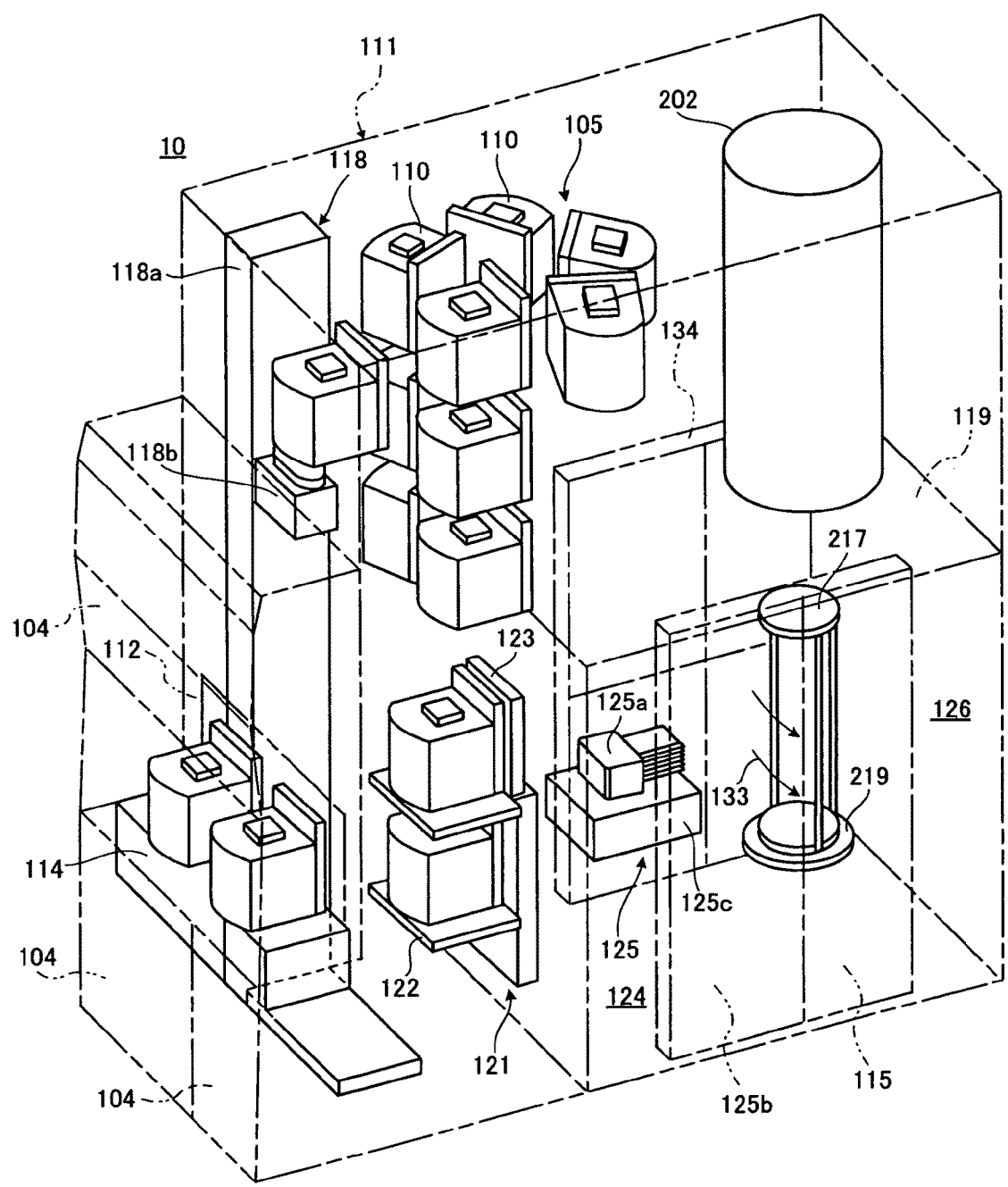
FIG. 2 is a perspective view to show the substrate processing apparatus according to the embodiment of the invention.

The substrate processing apparatus 10 is constructed, for example, as a semiconductor manufacturing apparatus that performs a method for manufacturing a semiconductor device (IC). Here, in the following description will be described a case in which the invention is applied to an upright apparatus (hereinafter referred to as simply "processing apparatus") that performs an oxidation processing, a diffusion processing, and a CVD processing to a substrate as a substrate processing apparatus. FIG. 2 shows a perspective view of a substrate processing apparatus to which the invention is applied, and FIG. 3 is a side perspective view of the substrate processing apparatus shown in FIG. 2.

Figure 3:
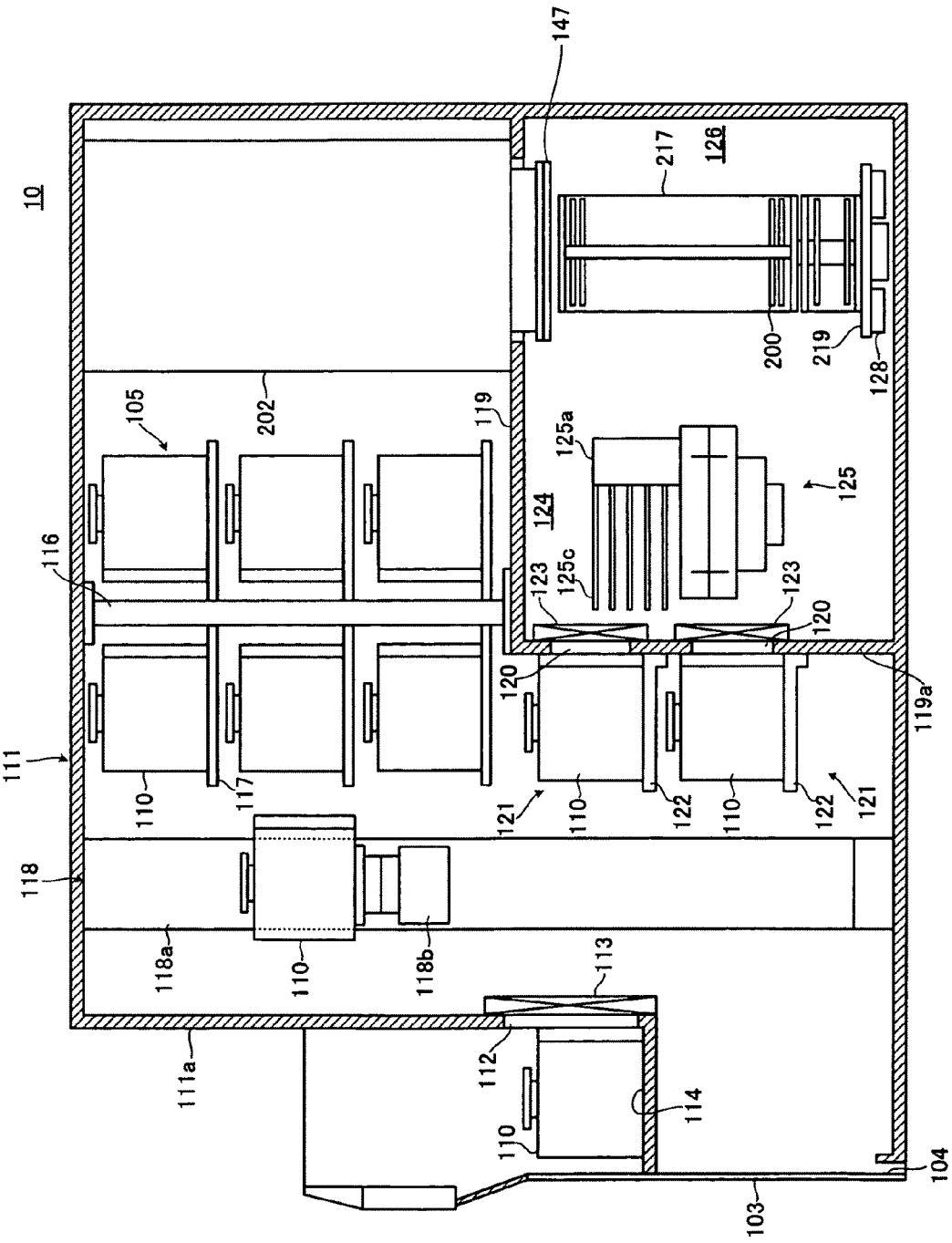
FIG. 3 is a side perspective view to show the substrate processing apparatus according to the embodiment of the invention.

As shown in FIG. 2 and FIG. 3, the substrate processing apparatus 10 of the invention that uses FOUPs (substrate receiving pods, hereinafter referred to as "pods") 110 as wafer carriers includes an enclosure 111, the wafer carrier receiving wafers (substrates) 200 made of silicon or the like. The enclosure 111 has a front maintenance opening 103 formed in the front forward portion of a front wall 111a thereof, the front maintenance opening 103 being an opening through which maintenance can be performed, and has front maintenance doors 104, 104 fixed to the front forward portion, the front maintenance doors 104, 104 opening or closing the front maintenance opening 103.

The front wall 111a of the enclosure 111 has a pod loading/unloading opening (substrate receiving pod loading/unloading opening) 112 formed therein so as to connect the inside and the outside of the enclosure 111, and the pod loading/unloading opening 112 is opened or closed by a front shutter (mechanism for opening or closing the substrate receiving pod loading/unloading opening) 113.

A load port (substrate receiving pod receiving/passing table) 114 is placed on the front forward side of the pod loading/unloading opening 112, and the load port 114 is constructed so as to have a pod 110 placed thereon and to align the pod 110. The pod 110 is loaded on the load port 114 by an intra-process carrying unit (not shown) and is unloaded from the load port 114.

A rotary pod shelf (substrate receiving pod placing shelf) 105 is disposed on a top portion at a nearly central portion in a front and rear direction in the enclosure 111. The rotary pod shelf 105 is constructed so as to store plural pods 110. That is, the rotary pod shelf 105 has a support pole 116 which is erected vertically and is rotated intermittently in a horizontal plane and plural shelf plates (substrate receiving pod placing tables) 117 which are supported radially at the respective upper, middle, and lower positions by the support pole 116, and the plural shelf plates 117 are constructed so as to hold the plural pods 110 in a state where each of the shelf plates 117 has the plural pods 110 placed thereon.

A pod carrying unit (substrate receiving pod carrying unit) 118 is interposed between the load port 114 and the rotary pod shelf 105 in the enclosure 111. The pod carrying unit 118 is constructed of a pod elevator (substrate receiving pod raising/lowering mechanism) 118a capable of raising and lowering the pods 110 while holding the pods 110 and a pod carrying mechanism (substrate receiving pod carrying mechanism) 118b as a carrying mechanism. The pod carrying unit 118 is constructed so as to carry the pods 110 between the load port 114, the rotary pod shelf 105, and a pod opener (mechanism for opening/closing a cover body of the substrate receiving pod) 121 by the sequential operation of the pod elevator 118a and the pod carrying mechanism 118b.

A subordinate enclosure 119 is formed to a rear end in the bottom portion in the nearly central portion in the front and rear direction in the enclosure 111. The front wall 119a of the subordinate box 119 has a pair of wafer loading/unloading openings (substrate loading/unloading openings) 120 formed therein next to each other in two upper and lower portions in a vertical direction, the pair of wafer loading/unloading openings 120 loading and unloading the wafers 200 into and from the subordinate box 119. The upper and lower wafer loading/unloading openings 120, 120 have a pair of pod openers 121, 121 fixed thereto, respectively. The pod openers 121, 121 have transfer tables 122, 122 and cap placing/removing mechanisms (cover body placing/removing mechanisms) 123, 123, respectively, the table 122 having the pod 110 placed thereon, the cap placing/removing mechanism placing and removing the cap (cover body) of the pod 110. The pod opener 121 is constructed so as to open or close the water loading/unloading opening of the pod 110 by removing or placing the cap of the pod 110 placed on the table 122 by the cap placing/removing mechanism 123.

The subordinate box 119 constructs a transfer chamber 124 that is fluidly separated from a space in which the pod carrying unit 118 and the rotary pod shelf 105 are disposed. The transfer chamber 124 has a wafer transfer mechanism (substrate transfer mechanism) 125 placed in a front region thereof. The wafer transfer mechanism 125 is constructed of: a wafer transfer unit (substrate transfer unit) 125a capable of rotating the wafer 200 or directly moving the wafer 200 in a horizontal direction; and a wafer transfer unit elevator (substrate transfer unit raising/lowering mechanism) 125b that raises or lowers the wafer transfer unit 125a. As schematically shown in FIG. 2, the wafer transfer unit elevator 125b is interposed between the right end portion of the pressure-resistant enclosure 111 and the right end portion of the front region of the transfer chamber 124 of the subordinate box 119. The wafer 200 is charged or discharged into or out of a boat (substrate holding part) 217 by using tweezers (substrate holding body) 125c of the wafer transfer unit 125a as a part having the wafer 200 placed thereon by the sequential operation of the wafer transfer unit elevator 125b and the wafer transfer unit 125a.

The transfer chamber 124 has a waiting part 126 constructed in the rear region thereof, the waiting part 126 housing the boat 217 and making the boat 217 wait. A processing furnace 202 is disposed above the waiting part 126. The bottom portion of the processing furnace 202 is constructed so as to be opened or closed by a furnace mouth shutter (furnace mouth opening/closing mechanism) 147.

As schematically shown in FIG. 2, a boat elevator (substrate holding part raising/lowering mechanism) 115 that raises or lowers the boat 217 is interposed between the right end portion of the pressure-resistant enclosure 111 and the right end portion of the waiting part 126 of the subordinate enclosure 119. A seal cap 219 as a cover body is horizontally placed on an arm 128 as a coupling part coupled to the elevator table of the boat elevator 115. The seal cap 219 is constructed so as to support the boat 217 vertically and to close the bottom portion of the processing furnace 202.

The boat 217 has plural holding parts (slots). Plural wafers (for example, 50 to 125 pieces of wafers) 200 are held horizontally in a state where the wafers 200 are aligned in the vertical direction with their centers set at the same position.

The boat 217 is one in this embodiment, but in some case, plural boats, for example, two boats can be disposed. In this case, the plural boats are referred to as a boat 217A and a boat 217B.

As schematically shown in FIG. 2, a clean unit 134 constructed of a supply fan and a dust preventing filter so as to supply clean air 133 of cleaned atmosphere or inert gas is disposed on a left end portion, opposite to the wafer transfer unit elevator 125b and the boat elevator 115, of the transfer chamber 124. A notch aligning unit (not shown) as a substrate aligning unit that aligns the positions in the circumferential direction of the wafers 200 is interposed between the wafer transfer unit 125a and the clean unit 134.

The clean air 133 blown out of the clean unit 134 is made to flow to the notch aligning unit, the wafer transfer unit 125a, and the boat 217 in the waiting part 126. Then, the clean air 133 is sucked into a duct (not shown), thereby being discharged to the outside of the enclosure 111, or is circulated to a primary side (supply side) of the suction side of the clean unit 134 and then is again blown off into the transfer chamber 124 by the clean unit 134.

Next, the operation of the substrate processing apparatus 10 of the invention will be described.

As shown in FIG. 2 and FIG. 3, when the pod 110 is supplied to the load port 114, the pod loading/unloading opening 112 is opened by the front shutter 113, and the pod 110 on the load port 114 is loaded into the enclosure 111 from the pod loading/unloading opening 112 by the pod carrying unit 118.

The loaded pod 110 is automatically carried and passed to the specified shelf plate 117 of the rotary pod shelf 105 by the pod carrying unit 118 and is temporarily stored there and then is carried from the shelf plate 117 to one pod opener 121 and is passed to the one pod opener 121 and is temporarily stored there and then is carried from the shelf plate 117 to one pod opener 121 and is transferred to the transfer table 122. Alternatively, the loaded pod 110 is carried directly to the pod opener 121 and is transferred to the transfer table 122. At this time, the wafer loading/unloading opening 120 of the pod opener 121 is closed by the cap placing/removing mechanism 123, and the transfer chamber 124 has the clean air 133 introduced thereinto, thereby being filled with the clean air 133. For example, the transfer chamber 124 is filled with a nitrogen gas as the clean air 133, thereby having an oxygen concentration set 20 ppm or less, that is, much lower than an oxygen concentration of the interior (atmosphere) of the enclosure 111.

The pod 110 placed on the transfer table 122 has its opening-side end surface pressed onto the opening edge portion of the wafer loading/unloading opening 120 in the front wall 119a of the subordinate enclosure 119 and has its cap removed by the cap placing/removing mechanism 123, whereby the wafer loading/unloading opening thereof is opened.

When the pod 110 is opened by the pod opener 121, the wafer 200 is picked up from the pod 110 through the wafer loading/unloading opening by the tweezers 125c of the wafer transfer unit 125a and is aligned by the notch aligning unit 135 (not shown) and then is loaded into the waiting part 126 disposed in the back of the transfer chamber 124 and then is charged into the boat 217. The wafer transfer unit 125a passing the wafer 200 to the boat 217 returns to the pod 110 and then charges the next wafer 200 to the boat 217.

While the wafer transfer mechanism 125 in this one (upper or lower) pod opener 121 is charging the wafer 200 into the boat 217, the other (lower or upper) pod opener 121 has another pod 110 carried and transferred thereto from the rotary pod shelf 105 by the pod transfer unit 118, and the operation of opening the pod 110 by the pod opener 121 is performed at the same time.

When a predetermined number of wafers 200 are charged into the boat 217, the bottom portion of the processing furnace 202 closed by the furnace mouth shutter 147 is opened by the furnace mouth shutter 147. Subsequently, the seal cap 219 is raised by the boat elevator 115, whereby the boat 217 holding the group of wafers 200 is loaded into the processing furnace 202.

After the boat 217 is loaded, an arbitrary processing is performed to the wafers 200 in the processing furnace 202. After the processing is finished, the wafers 200 and the pod are delivered to the outside of the enclosure 111 according to a procedure that is nearly opposite to the above-mentioned procedure, except for a wafer aligning process performed by the notch aligning unit 135 (not shown).

Next, a control unit (main controller) that controls the constituent elements of the substrate processing apparatus 10 will be described.

Figure 4:
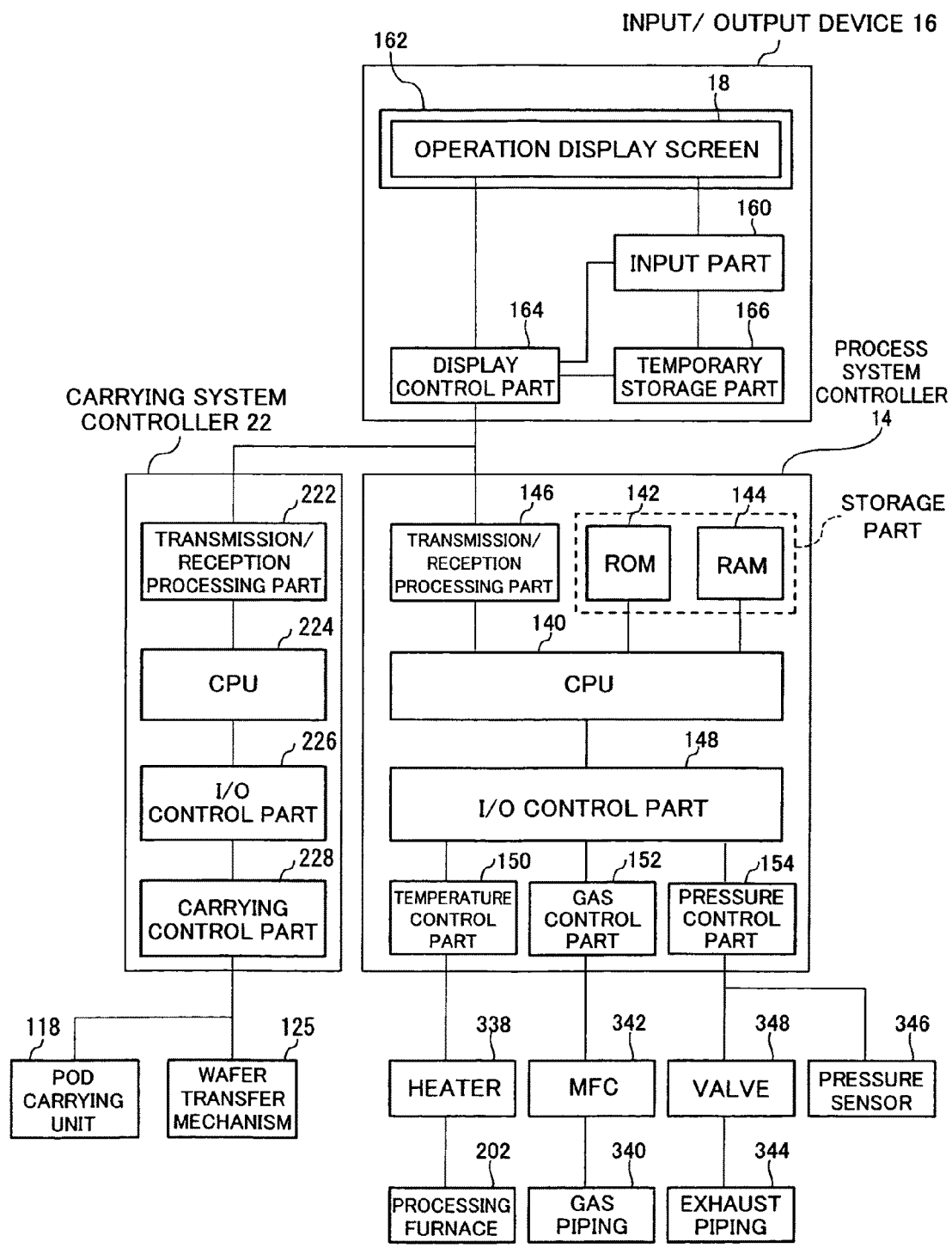
FIG. 4 is a block diagram to show a hardware construction at the center of a control unit of the substrate processing apparatus according to the embodiment of the invention.

FIG. 4 shows a hardware construction at the center of the control unit (main controller). The main controller is constructed of a process system controller 14, a carrying system controller 22, and an input/output device 16. The process system controller 14 includes: a CPU 140, a ROM (read-only memory) 142, a RAM (random-access memory) 144, a transmission/reception processing part 146 that transmits and receives data to and from the input/output device 16, a temperature control part 150, a gas control part 152, a pressure control part 154, and an I/O control part 148 that performs an I/O control to the temperature control part 150 and the like. The CPU 140 outputs control data (control instruction) that processes the substrate to the temperature control part 150, the gas control part 152, and the pressure control part 154 on the basis of a recipe that is made or edited by the operation display screen 18 of the input/output device 16 and which is stored in the RAM 144 and the like.

The carrying system controller 22, just as with the process system controller 14, includes a transmission/reception processing part 222 that transmits and receives data to and from the input/output device 16, a CPU 224, an I/O control part 226 that performs an I/O control, and a carrying control part 228. Here, the carrying system controller 22 has also a ROM and a RAM, but the ROM and the RAM are omitted in the drawing.

The carrying control part 228 controls the transfer units of the pod and the wafer such as the pod transfer unit 118 and the wafer transfer mechanism 125.

The ROM 142 and the RAM 144 form a storage part. In the ROM 142 or the RAM 144, a sequence program, input data (input instruction) inputted by plural recipes and the input/output device 16, the commands of the recipes; and production history data when the recipes are performed are stored. Here, the storage part may include a storage medium realized by a hard disk drive (HDD) and mass database (DB). In this case, the same data as the data stored in the RAM 144 is stored in the storage medium. In this manner, the ROM 142 or the RAM 144 (or storage part) is used as a storage unit that stores the production information of the substrate. Note, the storage part can be inside the process system controller 14 as referred the above, the storage part can be outside the process system controller 14.

The input/output device 16 includes an input part 160 for receiving input data (input instruction) of the user (operator) from the operation display screen 18, a display part 162 that displays data and the like stored in the RAM 144 and the like, a temporary storage part 166 that stores the input data received by the input part 160 and the production information of the substrate, which will be described later, until the input data and the production information are transmitted to the transmission/reception processing part 146 by the display control part 164, and a display control part 164 that receives the input data (input instruction) from the input part 160 and which transmits the input data to the display part 162 or the transmission/reception processing part 146.

The temperature control part 150 controls temperature in the processing furnace 202 by the output of a heater 338 disposed on the outer peripheral portion of the processing furnace 202. The gas control part 152 controls the quantity of supply of reactive gas to be supplied into the processing furnace 202 on the basis of the output value of an MFC (mass flow controller) 342 disposed in the gas piping 340 of the processing furnace 202. The pressure control part 154 controls pressure in the processing furnace 202 by opening or closing a valve 348 on the basis of the output value of a pressure sensor 346 disposed in the exhaust piping 344 of the processing furnace 202. In this manner, the sub-controller such as the temperature control part 150 controls the respective parts (heater 338, MFC 342, and valve 348) of the substrate processing apparatus 10 on the basis of the control instruction from the CPU 140.

Next, a method for displaying the production information of a processed substrate will be described.

First, the production management information of the substrate will be described by the use of FIG. 5.

Figure 5:
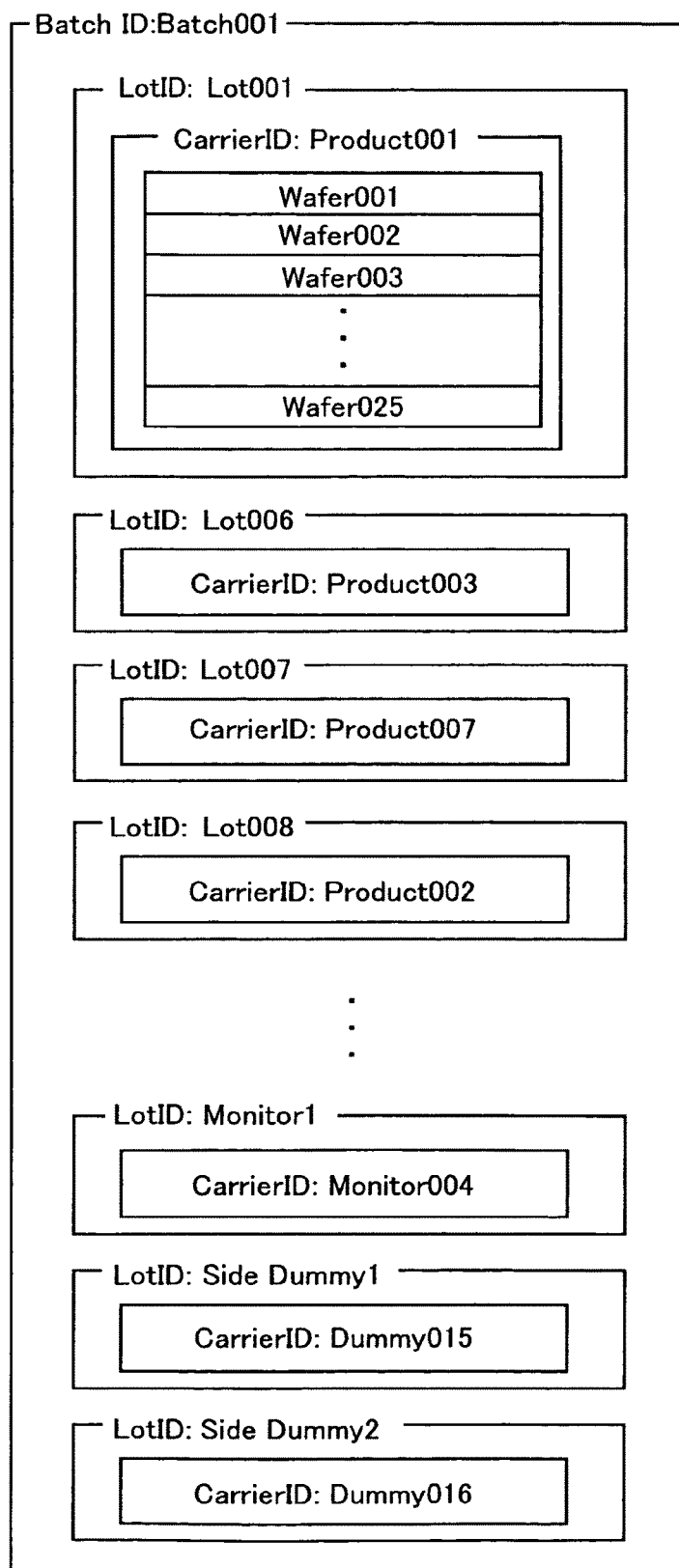
FIG. 5 is a construction diagram to show production management information in one batch in the embodiment of the invention.

FIG. 5 shows a diagram to describe the production management information in one batch. The above-mentioned upright semiconductor manufacturing apparatus is a batch processing apparatus, so that a processing unit is a batch. The batch is denoted by a management ID called "a batch ID" and is managed.

A lot means a management unit in which a predetermined number of wafers are collected and managed, and one batch includes plural lots. This lot is denoted by a management ID called "a lot ID".

As described above, when the substrate is carried between the units, the substrate is carried in a state where the substrate is received in the pod 110. This pod 110 is denoted by a management ID called "a carrier ID".

Moreover, each of the wafers is denoted by a management ID called "a wafer ID".

The wafers of different kinds are usually received separately for each carrier and processed, which results in bringing about a state in which "the carrier ID"="the lot ID". However, when the substrate processing process reaches a final process, the pod 110 is cleaned and reused. For this reason, the pod 110 denoted by the same "carrier ID" is passed plural times on the production line. The "lot ID" is denoted by a management ID that is used for manufacturing management and which does not overlap the other lot IDs also in the future. For this reason, the pod 110 is tied to the lot ID and is managed on the production line.

The pod 110 is tied to the management ID described above and has its product manufacturing process identified and managed. In this regard, the carrier IDs are denoted by management IDs distinguished from each other in the following manner: for example, a carrier ID for a product is denoted by "product 001"; a carrier ID for a monitor is denoted by "monitor 001; and a carrier ID for a dummy is denoted by "dummy 001".

In an inspection process in the latter part of the product manufacturing process, the wafers are inspected for each lot. When a defect is found in the inspection process, in many cases, the production history of a lot in which the defect is found in the inspection process is retroactively checked by using the lot ID of the lot as a key.

FIG. 6 is a schematic diagram to show one example of the wafers placed on the boat and their lot IDs when a defect is found. Here, a date when the wafers are inspected in the inspection process in the latter part (latter process) of the manufacturing process is an inspection date, and a date when the wafers have their films formed thereon in the processing furnace 202 is a processing date.

For example, it is assumed that a heating wire of the processing furnace 202 (see FIG. 2 and FIG. 3) is broken. When the heating wire is broken, the temperature around the heating wire is decreased. In this case, a film thickness defect or a film quality defect is caused in the film formed on the wafer. Such a defect can be found by an inspection device.

For example, it is assumed that a place where the heating wire was broken is a portion P of FIG. 6. Then, the wafers 200 placed in this portion P suffered the effect of the broken heating wire. However, when in the case of a thermocouple for monitoring the temperature in the processing furnace 202, a thermocouple that monitors the portion P suffered the effect of heat from the other zone shows temperature within a desired temperature range, in other words, the temperature control was successfully performed, it cannot be quickly found in many cases that the heating wire was broken. It is assumed that a batch 001, a batch 002, and a batch 003 were processed in a state where it was not found that the heating wire was broken as shown in FIG. 6. When these batches are inspected by the inspection device, the wafers 200 of the lot 001 of the batch 001, the wafers 200 of the lot 010, the lot 011, and the lot 012 of the batch 002, and the wafers 200 of the lot 020, the lot 021, and the lot 022 of the batch 003 become a defect.

In this case, it is searched from the production history which batch ID the lot ID found to be a defect was processed in and the wafer information of the batch ID is checked for what caused the defect. Here, the wafer information is information relating to a state where the wafers 200 charged into the substrate holding part was held and includes information to show which lot ID the wafers 200 processed in the batch ID belonged to and which slot (holding part) of the boat 217 the wafers 200 was held by.

In FIG. 6 is shown an example of the wafer information when the batch 001, the batch 002, and the batch 003 were processed. When the wafer information in plural batches can be easily found in this manner, a defect (for example, a break in the heating wire) can be easily found.

Next, a specific example will be described.

Figure 7:
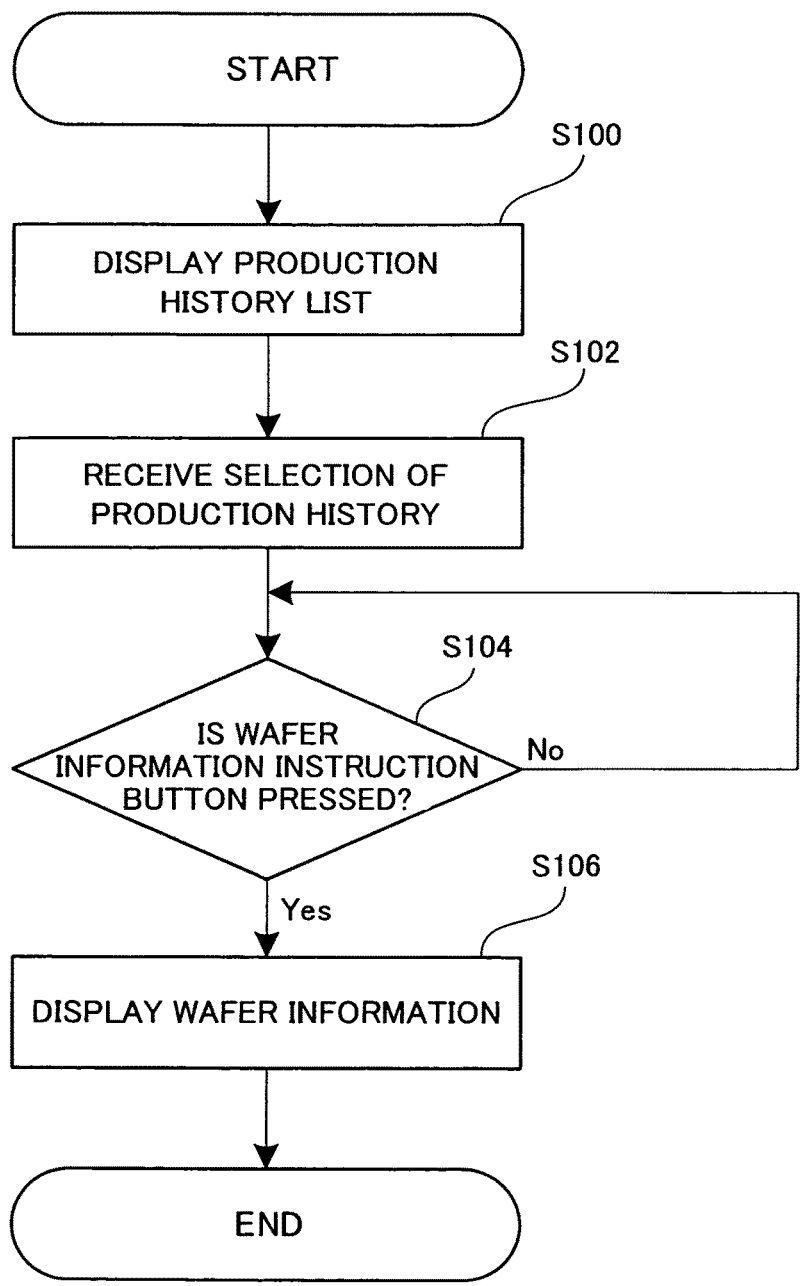
FIG. 7 is a flow chart to show a control flow of a main controller in the embodiment of the invention.

FIG. 7 is a flow chart to show a part of a control flow of the main controller. First, as shown in step S100, a production history list is displayed.

FIG. 8 is an example of the production history list displayed in step S100. The production history list, as shown in FIG. 8, has a search section 300 and a list display section 400. The search section 300 is used for narrowing down the production history by setting conditions. This search section 300 includes: unit name input part 301 that inputs the unit name of the substrate processing apparatus; a lot ID input part 302 that inputs the lot ID, a recipe name input part 303 that inputs a recipe name; a recipe period input part 304 that inputs a period of time that elapses after a recipe is started until the recipe is finished; a Cjob input part 305 that inputs a Cjob; a Pjob input part 306 that inputs a Pjob; and a search button 307. When the conditions are set and the search button 307 is pressed down, the production history meeting the conditions is displayed on the list display section 400.

In this regard, the Pjob is a name to designate the information of a period during which the wafers 200 are loaded into and processed in the processing furnace 202 (period of time that elapses after loading the wafers 200 into the boat 217 is finished until unloading the wafers 200 from the boat 217 is started). The Cjob is a name to designate the information of the Pjob and the information of a period of time required to carry the wafers (the period of time required for the wafers 200 to be unloaded from the pod 110, transferred to the boat 217, unloaded from the boat 217, and then returned to the pod 110).

The list display section 400 displays the plural of the production history or the production history narrowed by the search section 300 in newly produced order. The list display section 400 displays unit name, Cjob name, Pjob name, lot ID, recipe name, time to start a recipe, and time to finish the recipe as the production history. Here, numerals arranged vertically below "No" are serial numbers to designate the production history.

Figure 9:
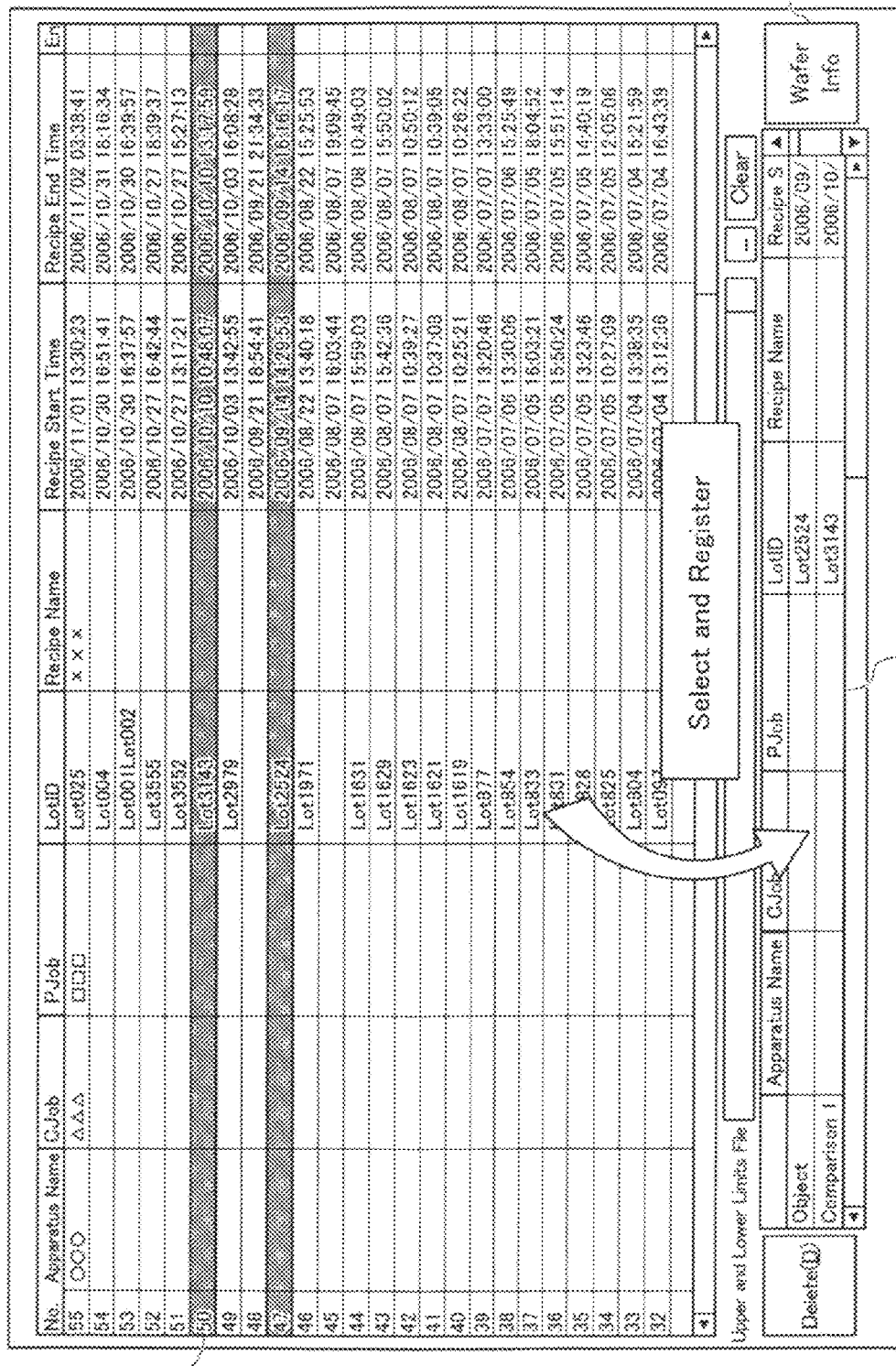
FIG. 9 is a screen diagram to show a second example of a production history in the embodiment of the invention.

Returning to FIG. 7, in the next step S102, the selection of the production history is received. The selection of the production history, as shown in FIG. 8, is performed by instructing the production history to display the wafer information from the production history displayed on the list display section 400. At this time, one or more production histories can be selected as a display object at the same time. In FIG. 9, there is provided a registration section 502 and the production history displayed on the selected list display section 400 is registered in the registration section 502.

When the selected production history is received (registered) in this manner, the routine proceeds to the next step S104 where the routine waits until a wafer information instruction button 500 as a substrate information switching part is pressed down. When the wafer information instruction button 500 is pressed down, the routine proceeds to step S106, and then the routine is finished.

In step S106, the wafer information is displayed. In this embodiment, a wafer information display screen shown in FIG. 10 is opened. The wafer information display screen has a production history display section 600 that displays the selected production history and a wafer information display section 700 that displays the wafer information. The production history display section 600 includes the same items as the items of the production history shown in FIG. 8 and FIG. 9.

The wafer information display section 700 displays the wafers 200 of which lot ID are mounted at which position of the boat 217. Numerals arranged in the longitudinal direction of the column of "Boat Slot No" are numbers that designate the slot positions of the boat 217 and which are assigned to the order from the bottom of the plural slots (holding parts) disposed in the boat 217. Reference symbols A, B arranged side by side in a lateral direction of the column of "Boat Slot No" in correspondence to the production history show the kinds of boats 217. When there are plural boats 217 (for example, boats 217A, boat 217B), the reference symbols A, B show that the wafers 200 were processed in which-kinds of the boats 217. The items of "object", "comparison 1", "comparison 2" . . . show the production histories selected in step S102, and the lots IDs in the respective production histories are shown in correspondence to the "Boat Slot No" (slot position of the boat 217). Here, when the production history is displayed in the wafer information display section 700, the order of display can be arbitrarily set.

A lot ID button 801 and a carrier ID button 802 are interposed between the production history display section 600 and the wafer information display section 700. When the carrier ID button 802 is pressed down, a carrier ID is displayed in place of the lot ID.

In this regard, in addition to the carrier ID, a slot number to show which slot of the pod 110 the wafer 200 is placed in may be additionally displayed, for example, as FOUP 13A-10. In this regard, FOUP 13A is information relating to the kind of a carrier and 10 shows a slot number. Here, the slot number is a number assigned, sequentially from the bottom, to the plural placing tables disposed in the pod 110.

Moreover, the lot ID and the carrier ID may be displayed by color according to the kind of wafer 200 (kind of wafer such as a dummy wafer and a product wafer).

Hereinafter, the other embodiments of the invention will be described.

Figure 11:
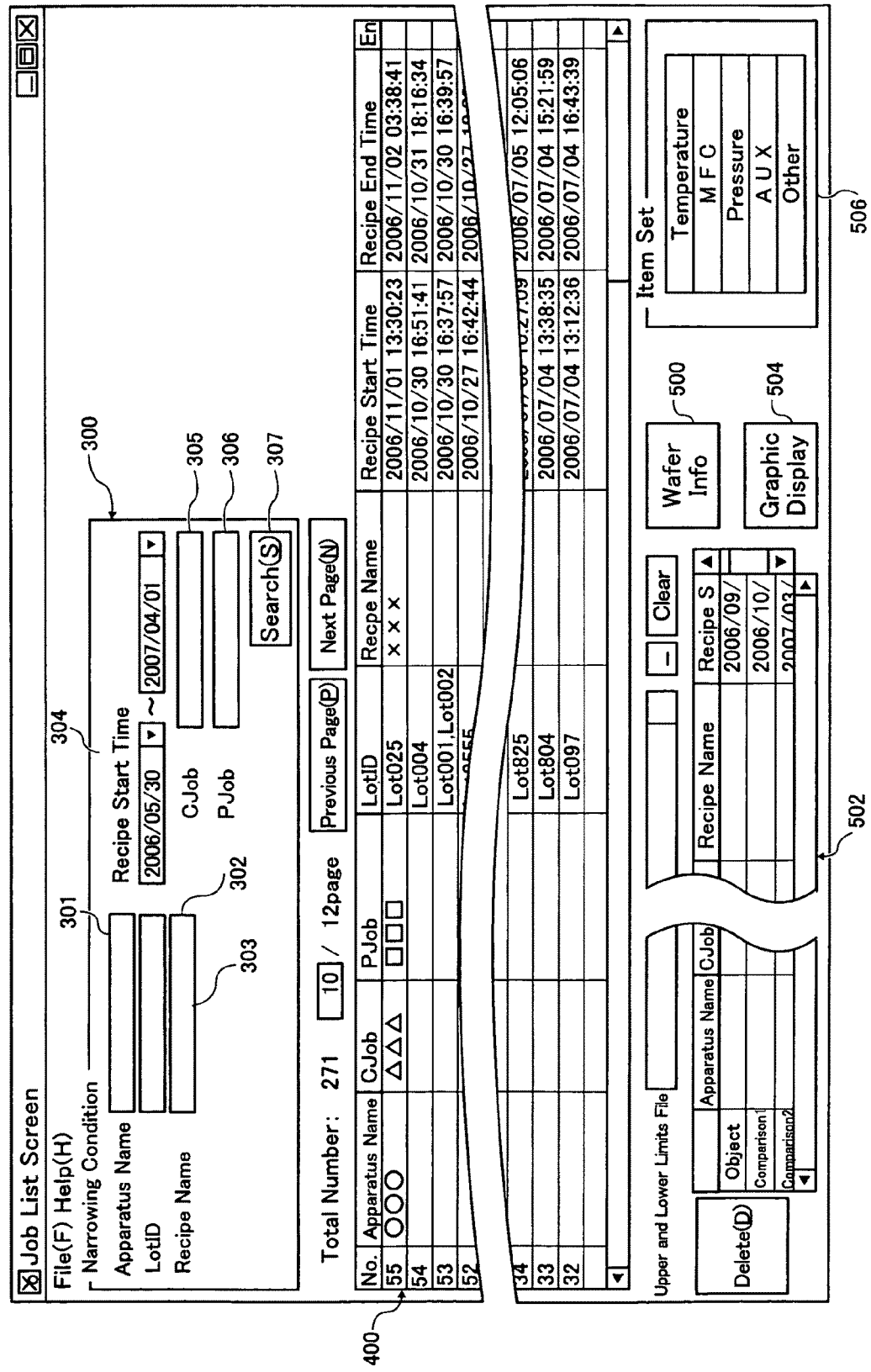
FIG. 11 is a screen diagram to show a production history in an other embodiment of the invention.

FIG. 11 is an example of a production history list displayed on the operation display screen 18 of the display part 162 shown in FIG. 4.

The production history list, as shown in FIG. 11, includes: a research section 300; a list display section 400; a wafer information instruction button 500 and a registration section 502 as a substrate information switching section, and in addition, a graphic display button 504 and an item selection part 506 as a production history switching section. When an item to be displayed by graph is selected by the item selection part 506 and the graphic display button 504 is pressed down, of the production histories selected by the list display section 400, the information relating to the item selected by the item selection part 506 is displayed as a separate screen (production information detail screen) or a separate window.

Further, it is needless to say that, just as in FIG. 9, when the wafer information display button 500 is pressed down, the wafer information display screen is opened.

Figure 12:
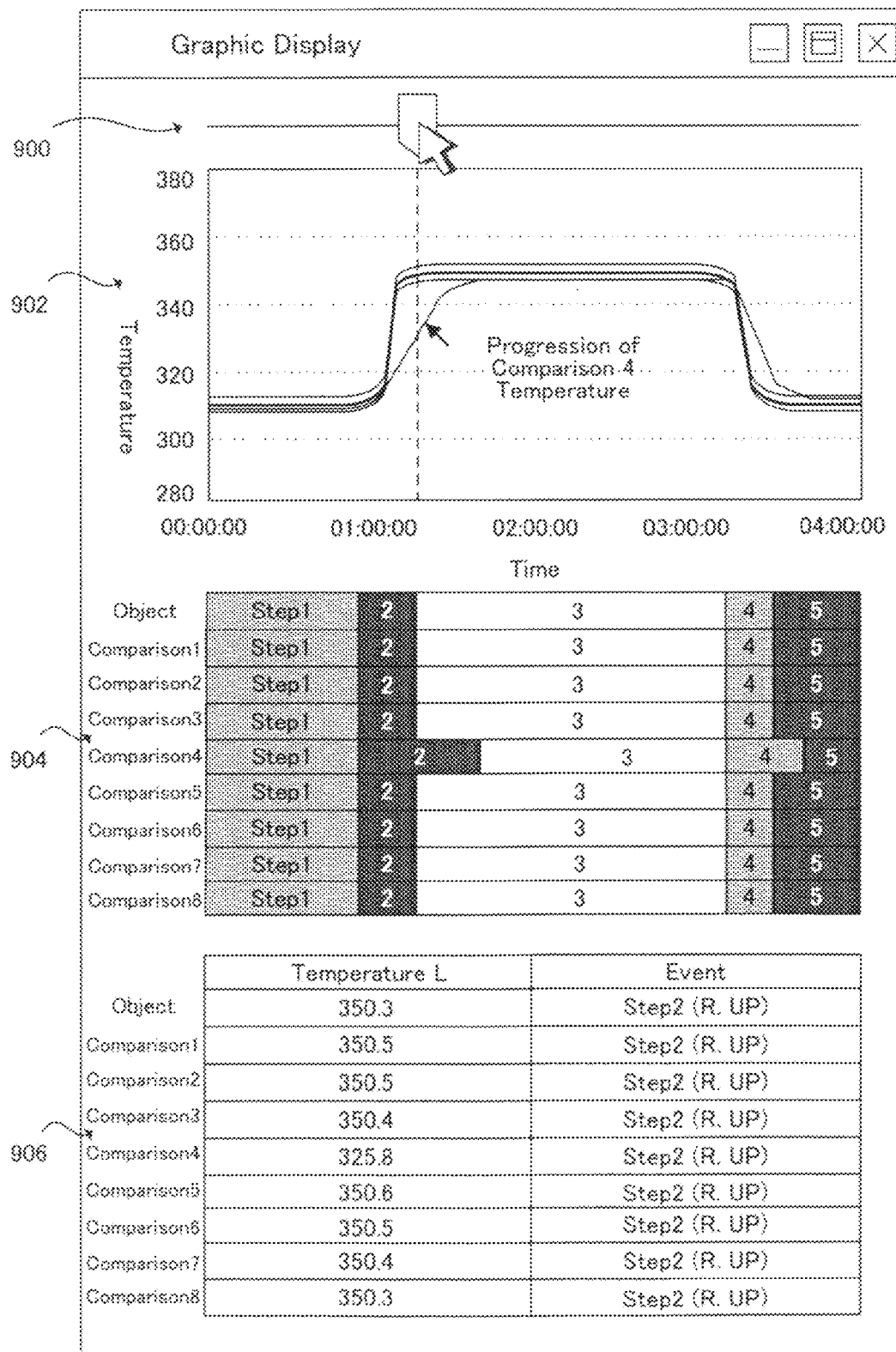
FIG. 12 is a screen diagram to show a detailed production history in the other embodiment of the invention.

FIG. 12 is an example of the production information detail screen displayed when temperature is selected by the item selection part 506 and the graphic display button 504 (FIG. 11) is pressed down.

The production information detail screen shown in FIG. 12 includes a point instruction part 900, a graphic display part 902, an event display part 904, and a point data display part 906.

The point instruction part 900 receives the cursor operation of the user and instructs any one of points of the graph displayed in the graphic display part 902.

The graphic display part 902 displays the progression of the item (here, temperature) selected by the item selection part 506 (see FIG. 11) in graph in time sequence.

The event display part 904 displays events (steps) performed while the substrate is being processed in time sequence. The time axis of the event display part 904 is common to that of the graphic display part 902.

The pointer data display part 906 displays: data (here, temperature) at a point instructed by the point instruction part 900; and an event performed at this point.

Here, in the production history shown as a comparison 4, it is found that: the temperature did not much increase in the middle of the processing; the time when the step 3 was performed delayed; the temperature did not decrease; and the time when the step 4 was finished delayed.

This embodiment is an example when the item to be displayed on the production information detail screen is the temperature. Thus, when the item is changed, the embodiment is variously modified.

FIG. 13 is an example of a wafer information display screen displayed when the wafer information display button 500 (see FIG. 9 and FIG. 11) is pressed down.

FIG. 13A is a first example of the wafer information display screen displayed when the wafer information display button 500 is pressed down in a case where the temperature during the substrate processing varies as shown by the graphic display part 902 (FIG. 12). As shown in FIG. 13A, it can be found that in the lot of the comparison 4 in which the lot ID is lot 005, a part of slots (here, slots 77 to 84) of the boat 217 do not hold the wafer 200. In this case, only the wafer 200 does not exist, so that a defect is not detected in many cases at the time of processing the substrates. This lot 005 is varied in a heat history as compared with the other lots, so that the lot 005 can be detected to be a defect in the latter process in some case. Even when a certain lot is not detected to be a defect in this manner at the time of processing the substrate, a part of lots that can become a defect can be identified by previously recognizing a change in the state where the wafers 200 are transferred. For example, in a case where the state of transfer of the wafers 200 is varied by several pieces of substrates in the comparison between a certain lot and the other lot, the film does not suffer the effect of the variation in the number of the substrates in many cases. Thus, when a defect is detected, it is difficult to identify a part with a defect. In this case, when a change in the state of transfer of the wafers 200 between the plural batches is checked, it is possible to find that the defect is caused by the difference in the transfer.

Figure 13B:
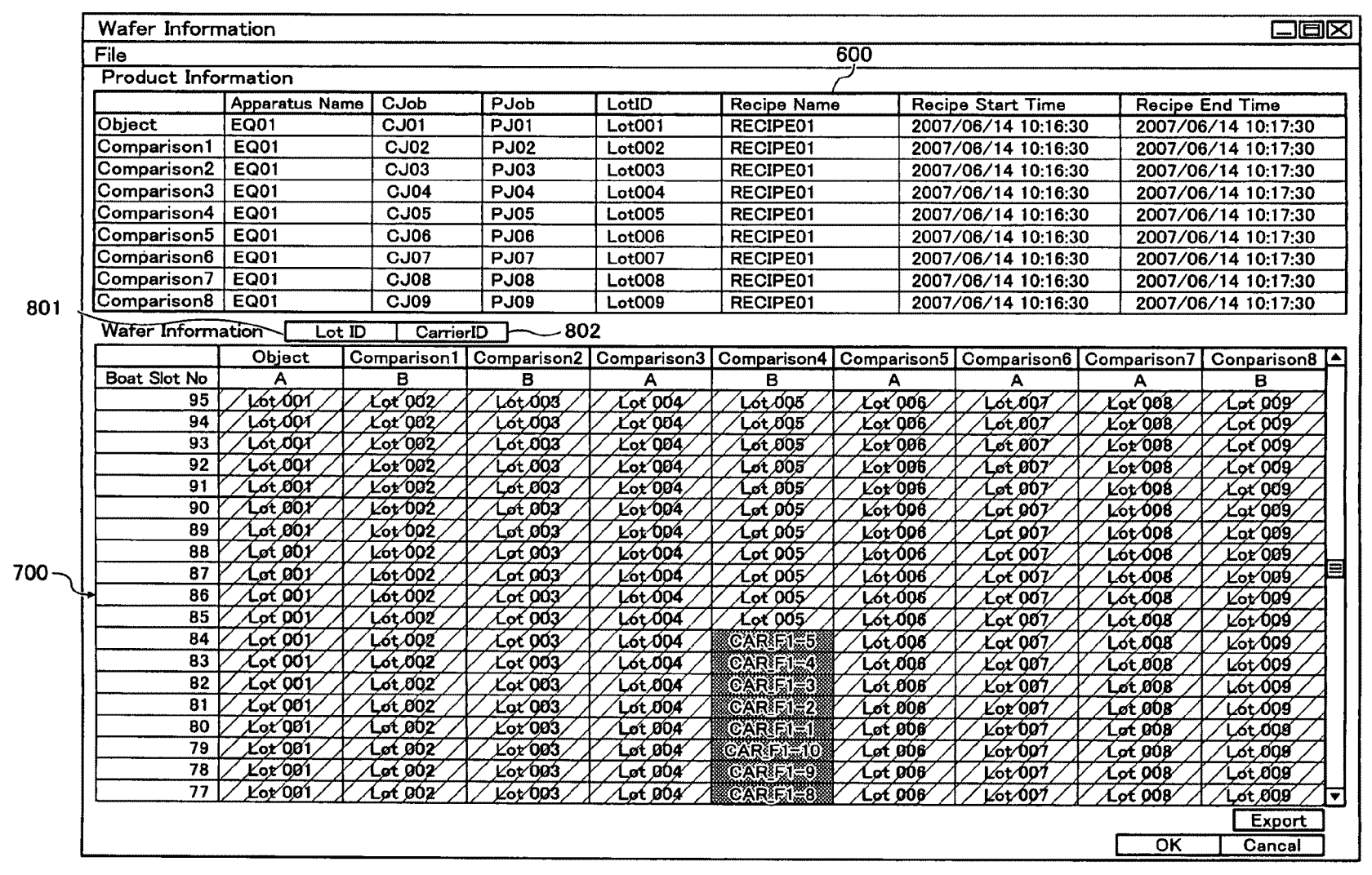

FIG. 13B is a second example of the wafer information display screen displayed when the wafer information display button 500 is pressed down in a case where the temperature during the substrate processing shows the progression shown in the graphic display section 902 (see FIG. 12). In this wafer information display screen, the lot name (in the case of dummy, a combination of the carrier name and carrier ID) is displayed by color according to the kind of lots (for example, product and monitor) and the kind of dummies not including the lot (for example, fill dummy and side dummy). As shown in FIG. 13B, it is displayed in a way easy to understand that fill dummy substrates are held only by the slots 77 to 84 of the comparison 4. Generally, it is difficult that the fill dummy substrate has a difference at first glance, but the fill dummy substrate produces an integrated film thickness to deteriorate the quality of the substrate, thereby causing a defect in cases. Even when it is difficult to determine a part with a defect, by checking a variation in the state of transfer of the wafers 200 between the plural batches, the part with a defect can be determined.

Moreover, when a fill dummy substrate is disposed in a specified lot in place of a product substrate and the substrate processing is finished without an operating mistake and a defect is detected in the latter process (inspection process), it is difficult to determine a part with a defect only by displaying only one batch as usual. This is because the operation using the fill dummy substrate has been conventionally performed. Even in this case, it is possible to determine the part with a defect by checking a variation in the state of transfer of the wafers 200 between the plural lots (batches).

As described above, according to this embodiment, the difference between the batches can be easily compared with each other by displaying the wafer information in a list in which plural batches are arranged. When the defect between plurality of batches is caused in the apparatus, a part with a defect caused between the batches can be determined by displaying the wafer production information between the batches as a list in this manner. A part with a defect between the batches can be easily determined in the following manner: for example, "the wafer of the lot in which a defect is caused is processed in the upper portion of the boat". Moreover, by combining the function of displaying and comparing the wafer production information between the batches with the other information (for example, information of the lot with a defect found in the inspection process), the part in which a lot with a defect is caused can be easily determined and hence the time required to check and search the cause of the defect can be made shorter.

Here, in the above-mentioned embodiment, the production history and the wafer information are displayed on the operation screen of the substrate processing apparatus. However, the invention is not limited to this but the production history and the wafer information may be displayed on the operation screen of the other device in the substrate processing system, for example, a device for managing the substrate processing apparatus such as a monitor server.

Moreover, the invention can be applied not only to the semiconductor manufacturing apparatus but also to an apparatus that processes a glass substrate such as an LCD apparatus as the substrate processing apparatus. The film forming processing includes, for example, CVD, PVD, a processing that forms an oxide film and a nitride film, and a processing that forms a film containing metal. Further, the upright processing apparatus has been described in this embodiment, but the invention can be also applied to a single wafer processing apparatus in the same way.

Further, the invention may be a method that: accumulates and stores production information relating to a substrate produced at the time of processing the substrate for each of the processing; displays the stored production history (history of the production information); receives plural selections of the displayed production history; switches a substrate information screen to show information relating to a state in which the substrate is held by a substrate holding part; in a case where the substrate information screen is switched to the substrate information screen, controls a device in such a way as to display the information relating to the state in which the substrate is held by the substrate holding part, with respect to the selected plural production histories; and detects a defect at the time of processing the substrate.

What is claimed is:

1. A substrate processing apparatus that loads a substrate holding part having many substrates which are held horizontally in a state where the substrates are aligned in the vertical direction with their centers set on the same vertical axis into a processing furnace and which performs a predetermined processing to the substrates, the substrate processing apparatus comprising:
a storage unit having a configuration that accumulates and stores production information relating to the substrate for each processing, the production information being produced when the substrate is processed;
a display part having a configuration that displays production histories stored in the storage unit;
an operation unit having a configuration that includes a reception part for receiving plural selections of the displayed production history and a substrate information switching part having a configuration that switches to a substrate information screen for showing information relating to a state of the substrates held in the substrate holding part; and a display control unit configured to control a display of information including the state in which the substrates are held in the substrate holding part with respect to the production histories displayed on the display part, wherein when the substrate information switching part is activated, the display control unit is configured to that display a variation in the state of transfer between the plural batches of the substrates on the substrate information screen for each of the selected production histories, the variation in the state of transfer is based on: (1) a presence or absence of substrates between the plural batches, or (2) a type of each substrate between the plural batches, the variation being detected through comparing the plural batches of the selected production histories, wherein the information relating to a state of the substrates held in the substrate holding part is the existence of the substrate.

2. The substrate processing apparatus according to claim 1, wherein the substrate holding part further includes a holding part having a configuration that holds the substrate loaded in the substrate holding part, and a number assigned to the holding part are numbers that are assigned to the order from the bottom of the substrate holding part and designate the slot positions of the substrate holding part.

3. The substrate processing apparatus according to claim 1, wherein the substrate information screen has a configuration that displays at least one of a type of each substrate held by the substrate holding part and plural management IDs.

4. The substrate processing apparatus according to claim 3, wherein the substrate information screen has a configuration that displays the information to show the type of each substrate held by the substrate holding part by color of each type of the substrate.

5. The substrate processing apparatus according to claim 1, wherein the operation unit further includes a production information switching part having a configuration that switches to a production information detail screen to show production information produced when the substrate is processed, and wherein when the production information switching part is pressed down, the display control unit has a configuration that displays the production information when the substrate is processed for each of the selected production history.

6. The substrate processing apparatus according to claim 5, wherein the operation unit further includes an item selection part having a configuration that selects an item to be displayed on the production information detail screen, and wherein the display control unit is configured to control such that the item selection part is pressed down, of the production information produced when the substrate is processed, the information relating to the item selected by the item selection part is displayed.

7. A substrate processing apparatus that loads a substrate holding part having many substrates which are held horizontally in a state where the substrates are aligned in the vertical direction with their centers set at the same position into a processing furnace and which performs a predetermined processing to the substrates, the substrate processing apparatus comprising:

a display part having a configuration that displays production information relating to the substrate for each processing, the production information being produced when the substrate is processed;

a reception part having a configuration that receives the selections of the production information; and a display control unit configured to control a display by switching to a substrate information screen for showing information relating to a variation in a state of the substrates held in the substrate holding part from the display of the product information with respect to the selected plural product information, the variation in the state of the substrates is based on: (1) a presence or absence of substrates between plural batches, or (2) a type of each substrate between plural batches, wherein the information relating to a state of the substrates held in the substrate holding part is the existence of the substrate.

8. The substrate processing apparatus according to claim 7, wherein the substrate information screen has a configuration that displays the information relating to the state in which the substrates are held in the substrate holding part in correspondence to a number assigned to a holding part that holds the substrate loaded in the substrate holding part.

9. The substrate processing apparatus according to claim 8, wherein the substrate holding part further includes a holding part having a configuration that holds the substrate loaded in the substrate holding part, and a number assigned to the holding part are numbers that are assigned to the order from the bottom of the substrate holding part and designate the slot positions of the substrate holding part.

10. The substrate processing apparatus according to claim 7, wherein the substrate information screen has a configuration that displays at least one of a type of each substrate held by the substrate holding part and plural management IDs.

11. The substrate processing apparatus according to claim 10, wherein the substrate information screen has a configuration that displays the information to show the type of each substrate held by the substrate holding part by color of each type of the substrate.

12. The substrate processing apparatus according to claim 7, wherein the display part further includes a production information switching part having a configuration that switches to a production information detail screen to show the production information produced when the substrate is processed, and when the production information switching part is pressed down, the display control unit has a configuration that displays the production information produced when the substrate is processed for each of the selected production histories.

13. The substrate processing apparatus as claimed according to claim 12, wherein the display part further includes an item selection part having a configuration that selects at least one item to display on the production information detail screen, and the display control unit is configured to control a display of information relating to the selected item according to the item selection part that is pressed down for each of the production information produced when the substrate is processed.

14. The substrate processing apparatus according to claim 7, wherein the production information includes: (1) process monitoring information such as a processing temperature and a gas flow rate; (2) processing performance information such as a recipe name used in the processing, and a processing date and time; (3) production management information such as a batch ID, a lot ID and a carrier ID; and (4) substrate identification information such as a substrate ID.

15. A substrate processing apparatus that loads a substrate holding part having many substrates loaded on the substrate holding part into a processing furnace and which performs a predetermined processing to the substrates, the substrate processing apparatus comprising:
   a display control unit configured to switch a file list display of production information relating to the substrates for each processing, the production information being produced when the substrate is processed, and a display of information that is stored in the file of the product information relating to a variation in a state of the substrates held in the substrate holding part, the variation in the state of the substrates is based on: (1) a presence or absence of substrates between plural batches, or (2) a type of each substrate between plural batches,
   wherein the information relating to a state of the substrates held in the substrate holding part is the existence of the substrate.

16. The substrate processing apparatus according to claim 15, wherein the production information includes: (1) process monitoring information such as a processing temperature and a gas flow rate; (2) processing performance information such as a recipe name used in the processing, and a processing date and time; (3) production management information such as a batch ID, a lot ID and a carrier ID; and (4) substrate identification information such as a substrate ID.

* * * * *